United States Patent
Petersen, II et al.

(10) Patent No.: US 11,507,149 B2
(45) Date of Patent: Nov. 22, 2022

(54) APPARATUSES FOR EXPANSION DEVICE RETENTION

(71) Applicant: Dell Products L.P., Hopkinton, MA (US)

(72) Inventors: Donald Leslie Petersen, II, Round Rock, TX (US); Hasnain Shabbir, Round Rock, TX (US); Raymond D. Heistand, II, Round Rock, TX (US)

(73) Assignee: Dell Products L.P., Hopkinton, MA (US)

( * ) Notice: Subject to any disclaimer, the term of this patent is extended or adjusted under 35 U.S.C. 154(b) by 245 days.

(21) Appl. No.: 16/925,577

(22) Filed: Jul. 10, 2020

(65) Prior Publication Data

US 2022/0011832 A1   Jan. 13, 2022

(51) Int. Cl.
*G06F 1/18* (2006.01)
*H05K 7/14* (2006.01)

(52) U.S. Cl.
CPC ........... *G06F 1/185* (2013.01); *H05K 7/1409* (2013.01); *H05K 7/1417* (2013.01)

(58) Field of Classification Search
CPC ..... G06F 1/185; G06F 1/186; H01R 12/7005; H01R 12/721; H01R 13/639; H05K 7/1409; H05K 7/1417
See application file for complete search history.

(56) References Cited

U.S. PATENT DOCUMENTS

| | | | | |
|---|---|---|---|---|
| 6,210,195 B1* | 4/2001 | Ma | ........................ | H01R 13/639 439/327 |
| 6,375,486 B1* | 4/2002 | Yu | ........................ | H01R 13/639 439/59 |
| 6,884,100 B1* | 4/2005 | Hsiao | ................... | H01R 12/721 439/327 |
| 6,902,419 B2* | 6/2005 | Conway | ............. | H01R 12/7005 439/347 |
| 7,121,862 B2* | 10/2006 | Tang | ................... | H01R 12/7005 439/327 |
| 7,160,126 B1* | 1/2007 | Lai | ........................ | H01R 13/639 439/327 |
| 7,946,875 B2* | 5/2011 | Li | ........................ | H01R 12/7005 439/347 |
| 2006/0018086 A1* | 1/2006 | Liu | ......................... | G06F 1/185 361/679.41 |

* cited by examiner

*Primary Examiner* — James Wu
(74) *Attorney, Agent, or Firm* — Chamberlain, Hrdlicka, White, Williams & Aughtry

(57) ABSTRACT

Apparatuses for expansion device retention. Specifically, the disclosed apparatuses implement retention mechanisms capable of being temporarily fastened to expansion slots whereat expansion devices may be installed. By fastening to the expansion slots, any permanent redesign and/or modification to the printed circuit boards, whereon the expansion slots may be mounted, may be minimized (if not eliminated). Amongst the disclosed apparatuses, an attachable hockey stick is introduced for expansion devices lacking a hockey stick shaped feature, where the attachable hockey stick engages with the aforementioned retention mechanisms to secure the expansion devices during, for example, shock events.

13 Claims, 17 Drawing Sheets

APPARATUSES FOR EXPANSION DEVICE RETENTION

BACKGROUND

Concerning expansion device retention, existing solutions for securing an expansion device often require a redesign of and/or modification to a hosting printed circuit board in order to accommodate the solution. Such existing solutions, thereby, add cost to the existing infrastructure supporting these expansion devices.

SUMMARY

In general, in one aspect, the invention relates to an apparatus for expansion device retention. The apparatus includes a fastenable body capable of temporarily fastening to an expansion slot for an expansion device, and a release mechanism affixed to the fastenable body, which when actuated, unfastens the fastenable body from the expansion slot.

In general, in one aspect, the invention relates to a computing system. The computing system includes a printed circuit board, a first expansion slot mounted on the printed circuit board, a first expansion device installed at the first expansion slot and including a hockey stick feature, and a first apparatus for expansion device retention, where the apparatus includes a first fastenable body capable of temporarily fastening to the first expansion slot, and a first release mechanism affixed to the first fastenable body, which when actuated, unfastens the first fastenable body from the first expansion slot.

Other aspects of the invention will be apparent from the following description and the appended claims.

DETAILED DESCRIPTION

Figure 1A:
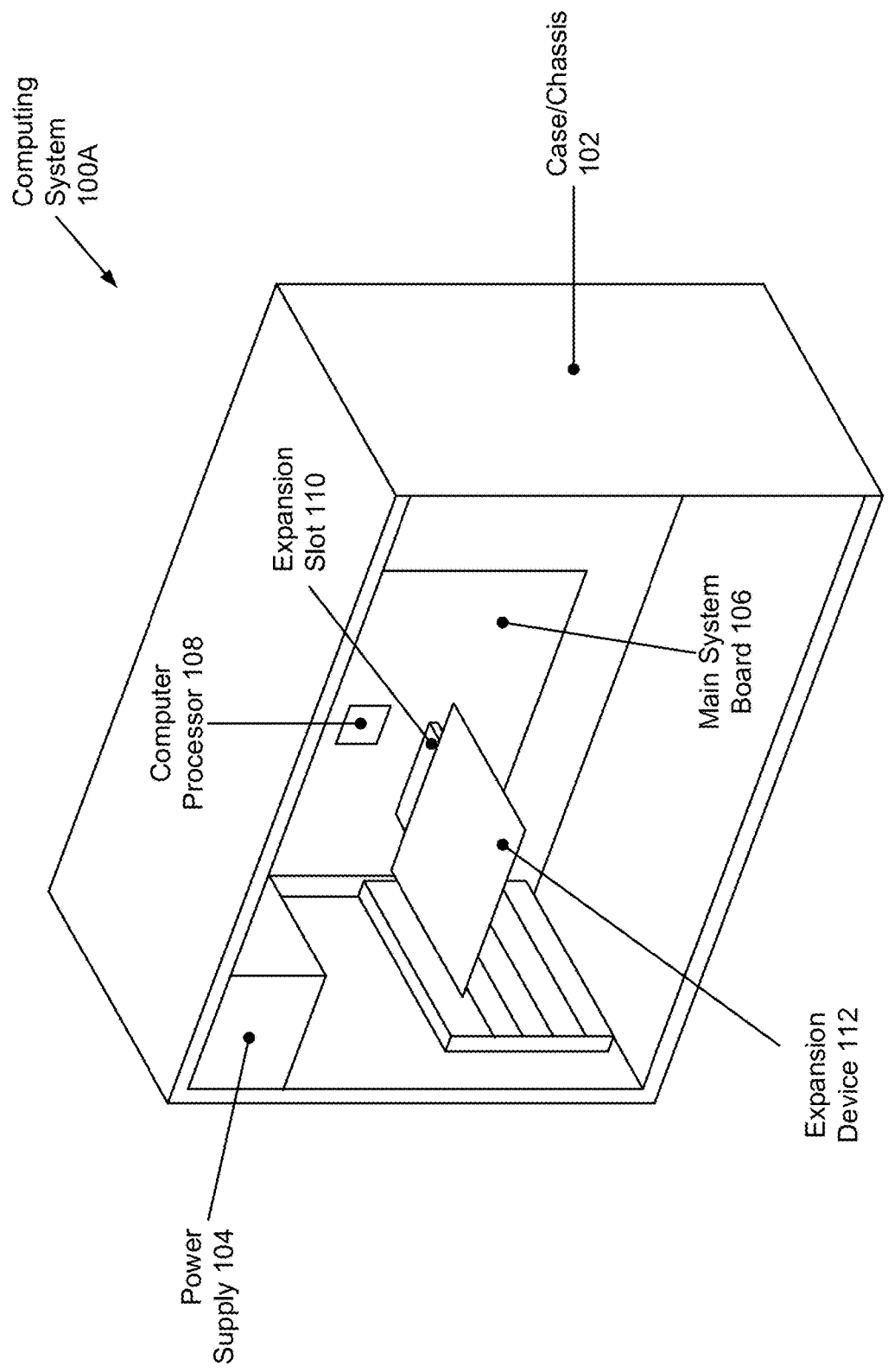
FIG. 1A shows a computing system in accordance with one or more embodiments of the invention.

Specific embodiments of the invention will now be described in detail with reference to the accompanying figures. In the following detailed description of the embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In the following description of FIGS. 1A-5D, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to necessarily imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and a first element may encompass more than one element and succeed (or precede) the second element in an ordering of elements.

Throughout the application, the phrase "fastenable" may be used to describe the physical body of various apparatuses disclosed herein. In being "fastenable", a physical body of an apparatus may be capable of being temporarily fastened to, as well as unfastened from, any specified object (or objects). Fastening of a physical body of an apparatus may entail a snap-on mechanism, a slide-on mechanism, a clip-on mechanism, or any other mechanism through which the physical body of an apparatus may be temporarily attached to the specified object(s).

In general, embodiments of the invention relate to apparatuses for expansion device retention. Specifically, one or more embodiments of the invention implement retention mechanisms capable of being temporarily fastened to expansion slots whereat expansion devices may be installed. By fastening to the expansion slots, any permanent redesign and/or modification to the printed circuit boards, whereon the expansion slots may be mounted, may be minimized (if not eliminated). Embodiments of the invention further introduce an attachable hockey stick for expansion devices lacking a hockey stick shaped feature, where the attachable hockey stick engages with the aforementioned retention mechanisms to secure the expansion devices during, for example, shock events.

Concerning expansion device retention, existing solutions for securing an expansion device often require a redesign of and/or modification to a hosting printed circuit board in order to accommodate the solution. By way of an example, one of the many existing retention solutions is an add-on retention arm, which must be soldered to the hosting printed circuit board. In order to implement this particular retention solution, the hosting printed circuit board must be redesigned for the placement of the add-on retention arm thereon. By way of another example, another of the many existing retention solutions is a retention arm integrated into certain card electromechanical (CEM) connectors. For hosting printed circuit boards already populated with non-integrated retention arm slots or sockets, these non-integrated retention arm slots/sockets must be unsoldered and subsequently replaced with this particular retention solution. In either case, and similarly across various other existing retention solutions, the existing infrastructure must be adapted to implement the solution. In contrast to these existing solutions, embodiments of the invention secure expansion devices to their respective expansion slots without requiring a redesign and/or modification to the hosting printed circuit board.

FIG. 1A shows a computing system in accordance with one or more embodiments of the invention. Examples of the computing system (100A) may include, but are not limited to, a desktop computer, a workstation computer, a server, or a mainframe. The computing system (100A) may include a case (102) (also referred to as a chassis) serving as a structural frame or housing within which various other, yet-to-be described components may be enclosed and/or to which one or more of these components may be affixed or mounted. The case (102) may be assembled from multiple panels (not shown) that may be fastened together using any number and any form of mechanical fasteners (not shown)— e.g., screws, bolts, latches, rivets, etc. Further, the case (102) may be constructed from lightweight, yet rigid and durable materials such as, for example, steel, aluminum, plastics, glass, carbon fiber, composites, or any combination thereof. The aforementioned other computing system (100A) components, which may be housed by the case (102), may include, but are not limited to, a power supply (104), a main system board (106), and at least one expansion device (112). Each of these computing system (100A) components is described below.

In one embodiment of the invention, the power supply (104) (also referred to as an alternating current to direct current (AC/DC) power converter) may represent a physical device designed and configured to provide operational power to one or more other computing system (100A) components—e.g., the main system board (106), the at least one expansion device (112), etc. To that extent, the power supply (104) may include functionality to convert or step-down AC high-voltage from a wall socket or outlet of electricity to one or more DC low-voltages required and regulated for stable operation of the computing system (100A). Furthermore, the power supply (104) may include circuitry (e.g., rectifiers, transformers, voltage dividers, voltage regulators, etc.) necessary to perform the AC/DC conversion.

In one embodiment of the invention, the main system board (106) (also referred to as a motherboard) may represent a printed circuit board whereon various electronic components may reside. These various electronic components may include, but are not limited to, one or more computer processors (108), non-persistent storage (not shown) (e.g., volatile memory, such as random access memory (RAM) and cache memory), one or more communication interfaces (not shown), and numerous other elements (e.g., at least one expansion slot (110) (described below)).

In one embodiment of the invention, the computer processor(s) (108) may represent an integrated circuit for processing instructions. For example, the computer processor(s) (108) may refer to one or more cores or micro-cores of a central processing unit (CPU) and/or a graphics processing unit (GPU). The communication interface(s) (not shown) may refer to physical device(s), including integrated circuits, for connecting the computing system (100A) to a network (not shown) (e.g., a local area network (LAN), a wide area network (WAN) such as the Internet, a mobile network, any other network type, or a combination thereof) and/or to other computing systems (not shown) or devices.

In one embodiment of the invention, an expansion device (112) (also referred to as a peripheral device) may represent any physical device, including circuitry, that may implement new or enhance existing features and/or functionalities of the computing system (100A). Examples of an expansion device (112) may include, but are not limited to, graphics adapter cards, network interface cards, sound adapter cards, varying interface (e.g., Bluetooth, FireWire, Universal Serial Bus (USB), parallel, Integrated Drive Electronics (IDE), serial, Small Computer System Interface (SCSI), etc.) controller cards, etc. An expansion device (112) may also represent any physical device, including circuitry, that may incorporate persistent storage into the computing system (100A). Examples of persistent storage devices may include, but are not limited to, hard disk drives (HDD), solid state drives (SSD), optical drivers such as compact disk (CD) drives or digital versatile disk (DVD) drives, flash memory, etc.

Furthermore, in one embodiment of the invention, an expansion device (112) may mechanically and electrically couple to/with the main system board (106) via an expansion slot (110). An expansion slot (110) may refer to a connector or socket whereat an expansion device (112) may be installed. Specifically, the expansion device (112) may include an edge connector, which may mate with the expansion slot (110), as well as the row of contacts therein, to establish the electrical coupling to the main system board (106). Though varying types of expansion slots (110) have been introduced, such as accelerated graphics port (AGP), audio/modem riser (AMR), communication and network riser (CNR), extended industry standard architecture (EISA), industry standard architecture (ISA), and video electronics standard association (VESA), the most commonly employed types of expansion slots (110) found in modern computing systems (100A) include peripheral component interconnect (PCI) and PCI express (PCIe).

While FIG. 1A shows a configuration of components, other computing system (100A) configurations may be used without departing from the scope of the invention. For example, the computing system (100A) may include one or more input devices (not shown) (e.g., touchscreen, keyboard, mouse, microphone, touchpad, electronic pen, etc.) and/or one or more output devices (not shown) (e.g., display, printer, external storage, speakers, etc.) that may operatively connect to and, accordingly, may be accessed through, the main system board (106).

Figure 1B:
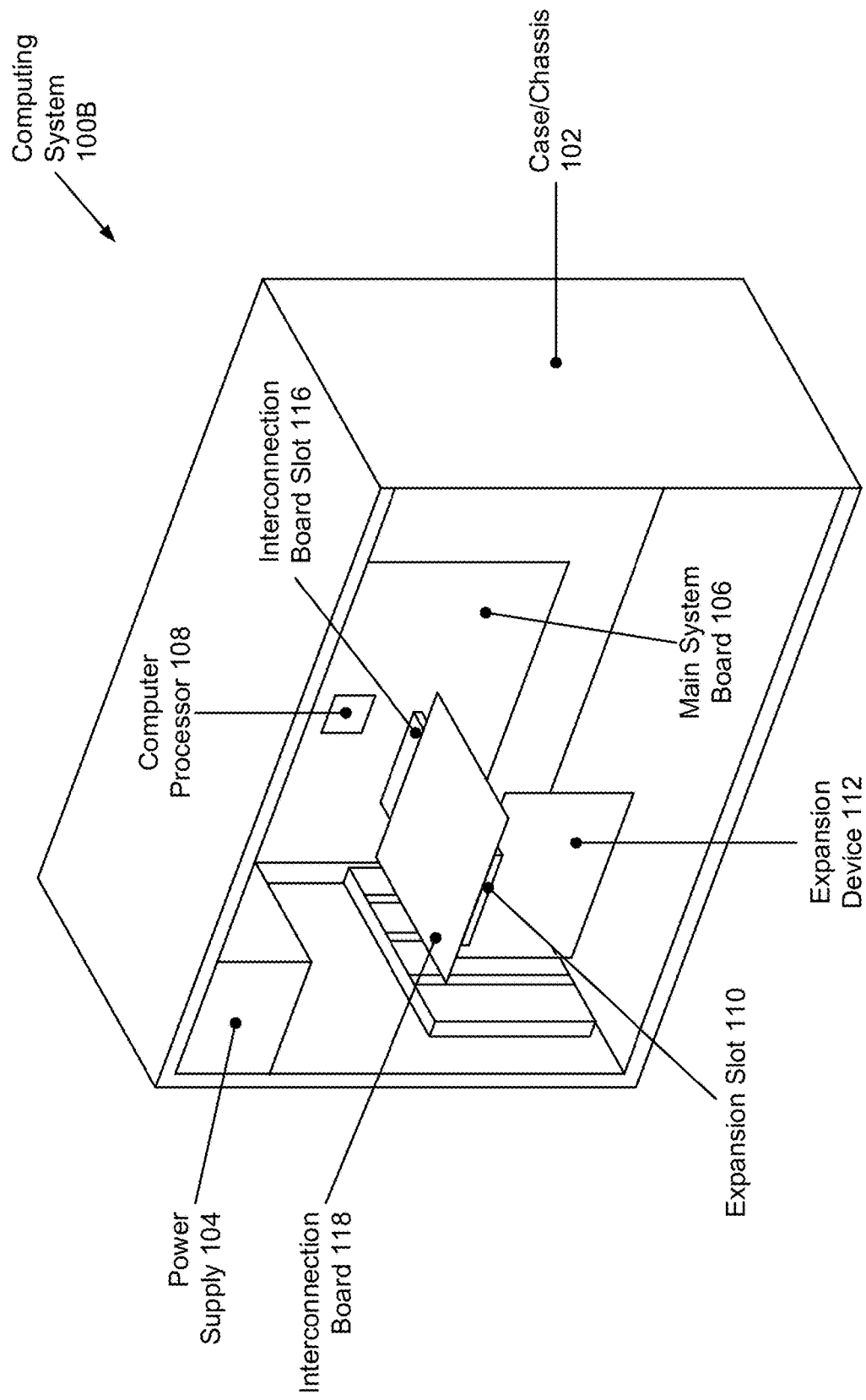
FIG. 1B shows a computing system in accordance with one or more embodiments of the invention.

By way of another example, in reference to FIG. 1B, a computing system (100B) may alternatively include an interconnection board (118) mechanically and electrically interposed between the main system board (106) and one or more expansion devices (112). An interconnection board (118) may represent a printed circuit board with minimal circuitry that may be shared amongst one or more expansion devices (112). Said shared circuitry may include, but is not limited to, power, sideband (e.g., control and/or monitoring), and/or fabric (e.g., high-speed data) signal distribution circuitry. An interconnection board (118) may further include one or more expansion slots (110) for connecting one or more expansion devices (112) indirectly to the main system board (106). Moreover, an interconnection board (118) may mechanically and electrically couple to/with the main system board (106) via an interconnection board slot (116). An interconnection board slot (116) may refer to a connector or socket whereat an interconnection board (118) may be installed. Specifically, the interconnection board (118) may include an edge connector, which may mate with the interconnection board slot (116), as well as the row of contacts therein, to establish the electrical coupling to the main system board (106). By way of examples, an interconnection board (118) may be implemented as a riser card or a backplane.

Figure 2A:
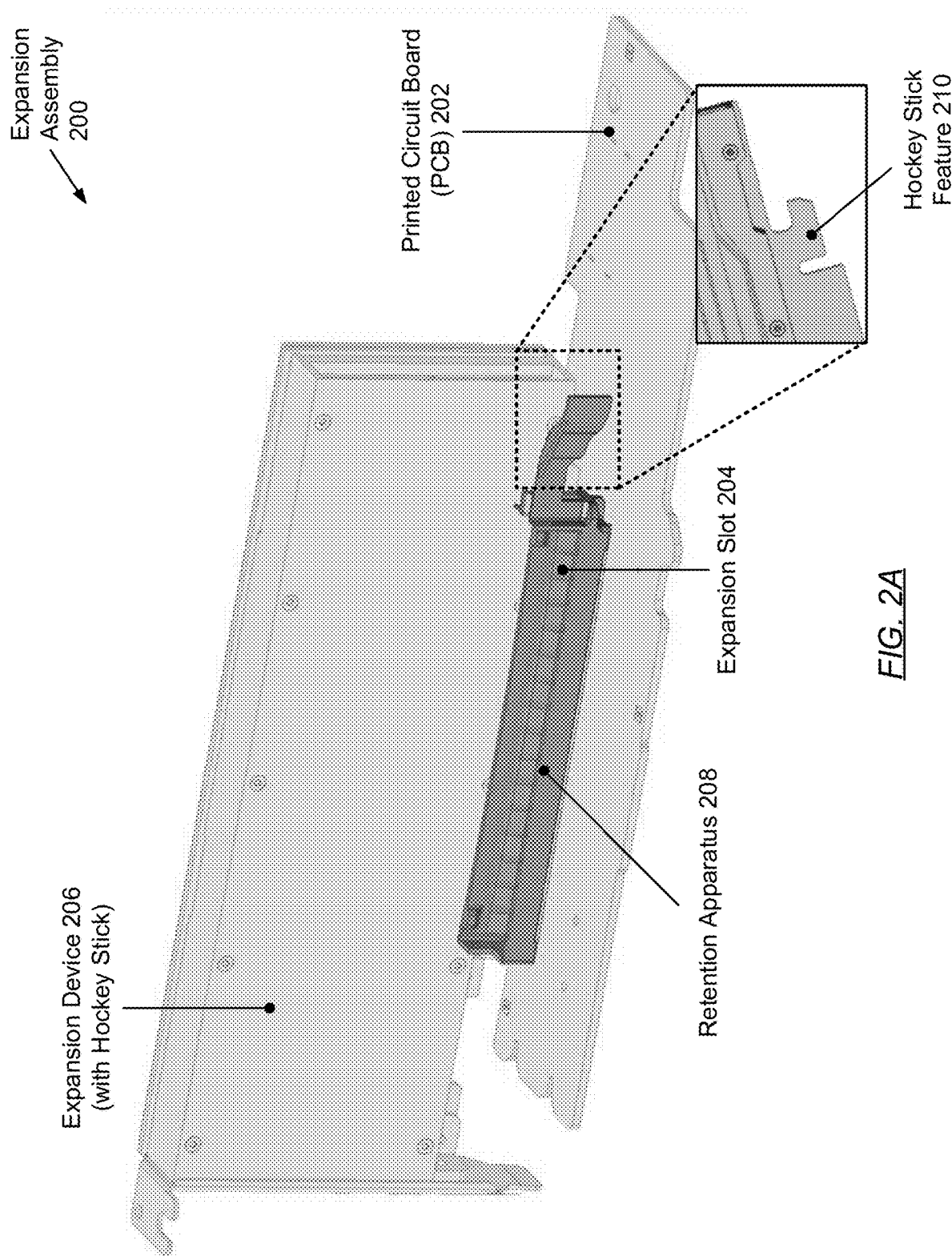
FIG. 2A shows an expansion assembly in accordance with one or more embodiments of the invention.

FIG. 2A shows an expansion assembly in accordance with one or more embodiments of the invention. An expansion assembly (200) may represent a number of components collectively integral to expansion device retention. These components may include, but are not limited to, a printed circuit board (202), an expansion slot (204), an expansion device (206), and a retention apparatus (208).

In one embodiment of the invention, the printed circuit board (202) may represent the main system board (or motherboard) of a computing system, or an interconnection board (e.g., riser card or backplane) incorporated therein (see e.g., FIGS. 1A and 1B). Amongst a bevy of electronic subcomponents interconnected through various conductive pathways and contacts, the printed circuit board (202) may include one or more expansion slots (204) mounted thereon. Each expansion slot (204) (described above) may serve as a mechanical and electrical coupler between an expansion device (206) and the printed circuit board (202). Further, the expansion device (206) may present a hockey stick shaped feature (210) on its bottom (near its edge connector), which may be designed to assist retention mechanisms either mounted directly on the printed circuit board (202) or integrated into the expansion slot (204). The retention apparatus (208) (described in further detail below (see e.g., FIG. 2B)) may subsequently fasten around the expansion slot (204) and latch onto the hockey stick shaped feature (210) of the expansion device (206) to minimize, if not eliminate, expansion device (206) movement, especially during shock events, without permanent redesign and/or modification to the printed circuit board (202).

Figure 2B:
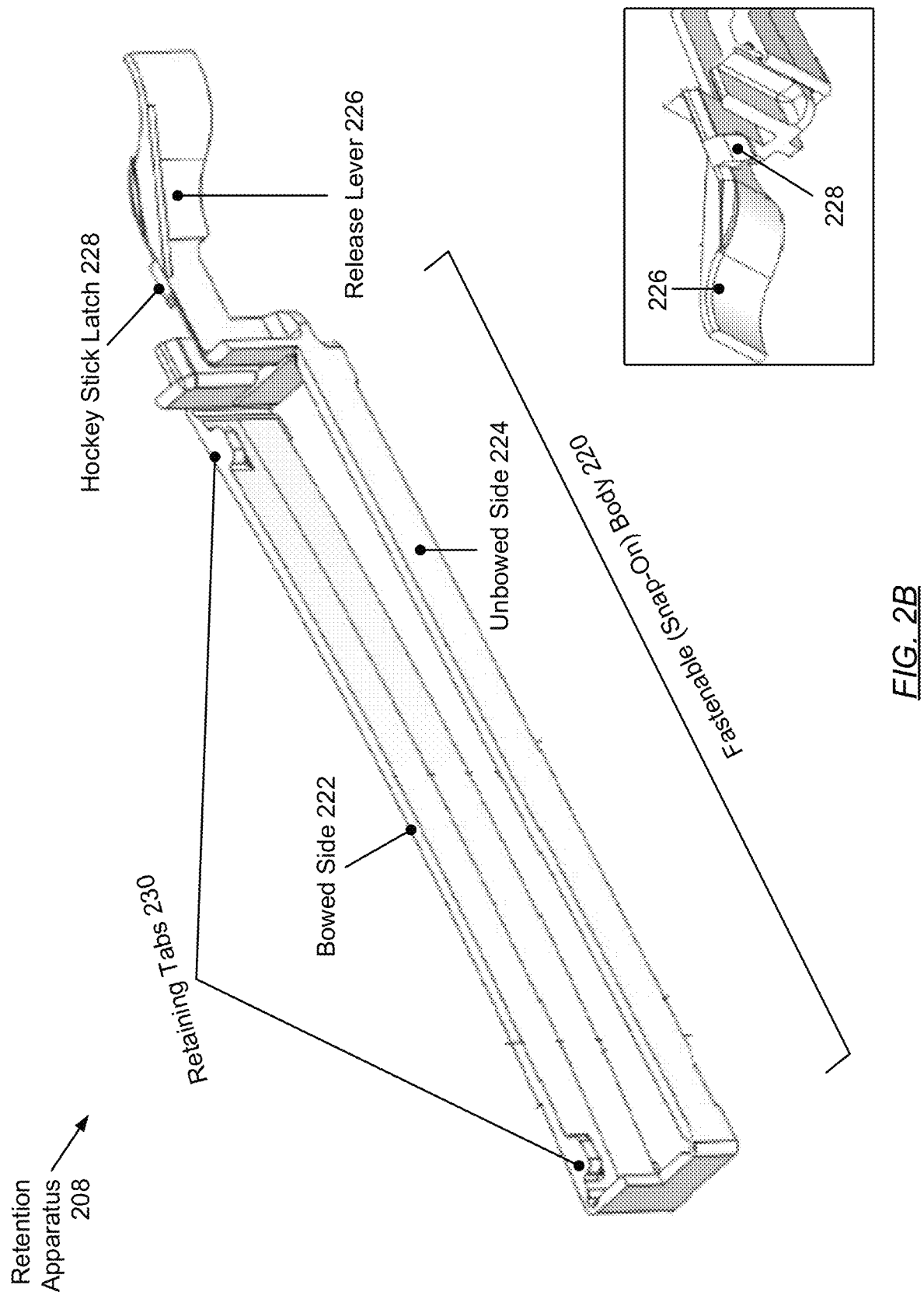
FIG. 2B shows a retention apparatus in accordance with one or more embodiments of the invention.

FIG. 2B shows a retention apparatus in accordance with one or more embodiments of the invention. The retention apparatus (208) may include a fastenable body (220) and a release mechanism in the form of a release lever (226). The fastenable body (220) may form a closed hollow cuboid including four sides, which may respectively hug, when fastened (or snapped) around, the four lateral faces of an expansion slot (not shown). Of the four sides, two oppositely disposed sides may be elongated similar to the length of the expansion slot, while the remaining two oppositely disposed sides may be shortened similar to the width of the expansion slot. Further, one of the elongated sides—i.e., a bowed side (222)—may be curved, whereas the remaining three sides may be straight or unbowed—e.g., unbowed side (224). The bowed side (222) of the fastenable body (220) may serve two purposes: (a) to provide compliance for snapping onto the expansion slot; and (b) to provide force to keep the oppositely disposed elongated side under the ridges of the expansion slot (see e.g., FIG. 2D). The fastenable body (220) may also include two retaining tabs (230) each disposed at an opposing top edge of the bowed side (222). These retaining tabs (230) may function to secure the retention apparatus (208) in place when actuating the release lever (226).

In turn, in one embodiment of the invention, the release lever (226) may be affixed to one of the shortened sides of the fastenable body (220). The release lever (226) may include a hockey stick latch (228), which may align with and lodge against the hockey stick shaped feature (see e.g., FIG. 2A) of a retained expansion device (not shown). Furthermore, the release lever (226) may function to unfasten the fastenable body (220), and accordingly, the retention apparatus (208), from the expansion slot (not shown) when actuated. More specifically, when actuated, the release lever (226) may dislodge the hockey stick latch (228) from the hockey stick shaped feature of the retained expansion device, as well as straighten (or unbow) the bowed side (222) of the fastenable body (220). Straightening the bowed side (222) may relieve the force applied by the bowed side (222), which had kept the oppositely disposed elongated side secured under ridges of the expansion slot. Moreover, the release lever (226) may also function as a handle for handling the retention apparatus (208).

In one embodiment of the invention, the retention apparatus (208) may be manufactured through, for example, injection molding. Injection molding may refer to a manufacturing process where heated material may be injected into a mold cavity, where the heated material eventually cools and hardens to the configuration of the mold cavity. Further, the heated material may include, but is not limited to, non-conductive material, such as thermoplastics (e.g., nylon, polyethylene, and polystyrene) or thermosetting plastics (e.g., epoxy and phenolic polymers/resins).

Figure 2C:
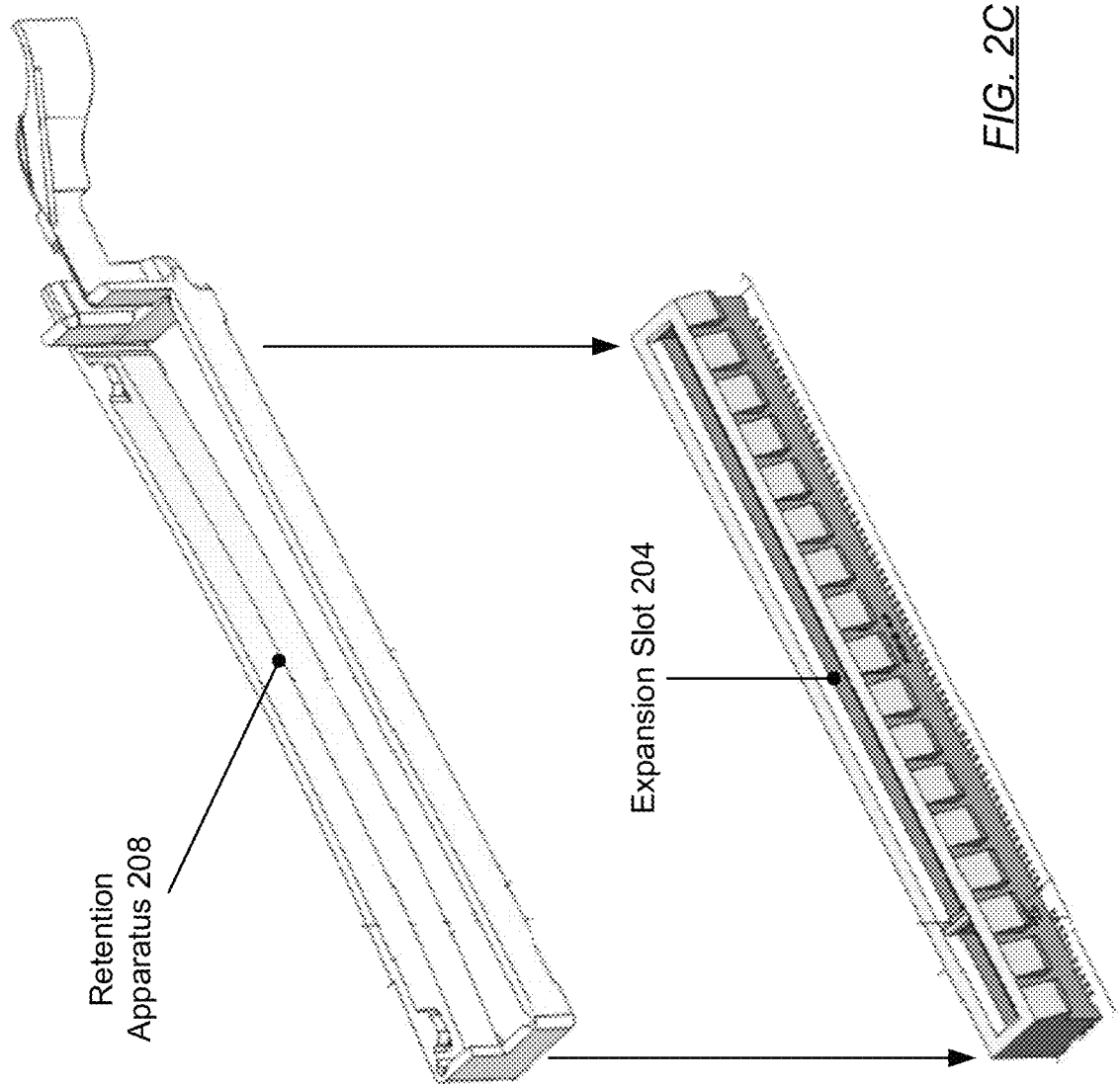
FIG. 2C shows a pre-assembly of components in accordance with one or more embodiments of the invention.
Figure 2D:
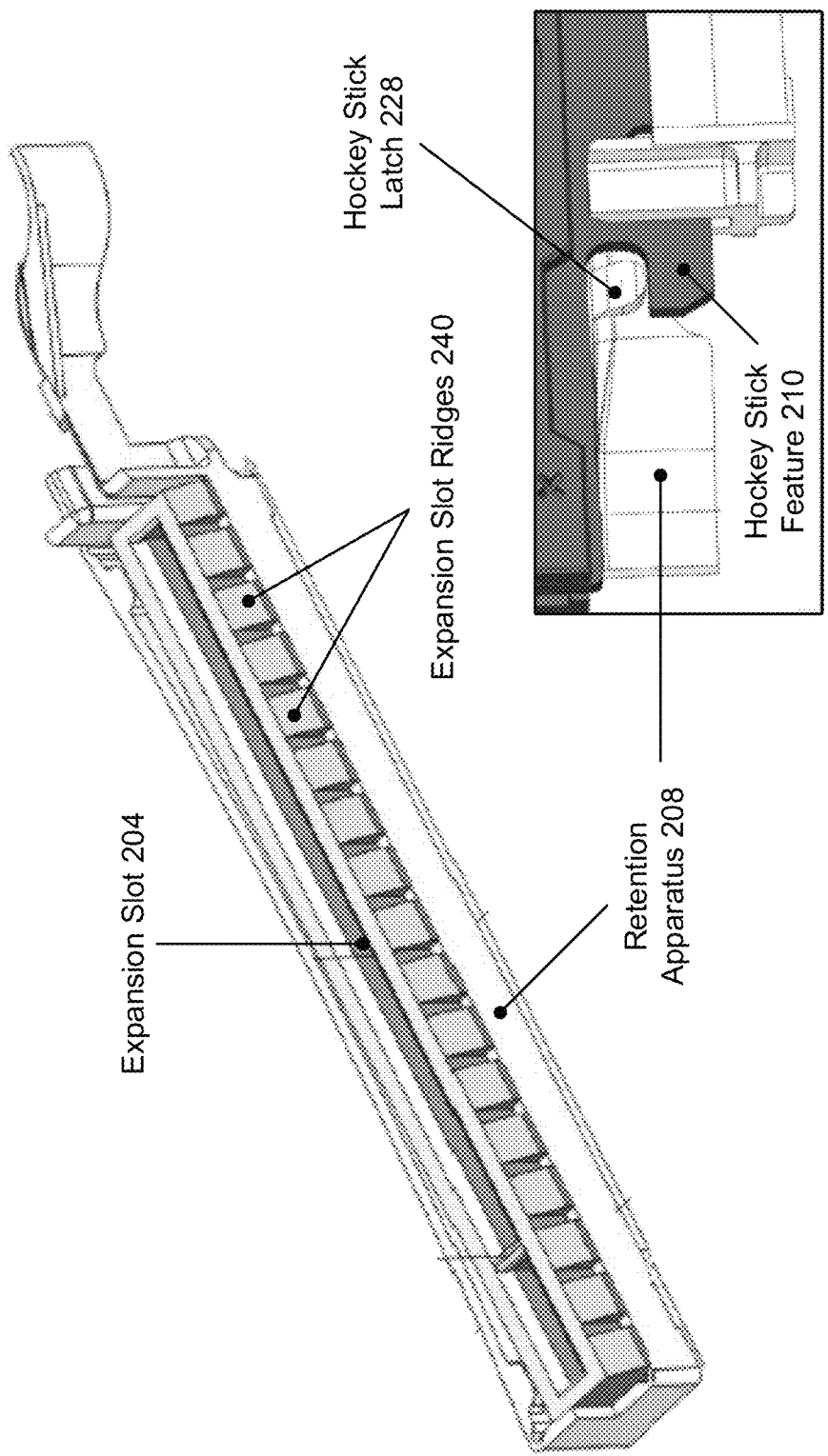
FIG. 2D shows a post-assembly of components in accordance with one or more embodiments of the invention.

FIGS. 2C and 2D show a pre-assembly and post-assembly, respectively, of components in accordance with one or more embodiments of the invention. Specifically, the former illustrates how a retention apparatus (208) may be fastened to an expansion slot (204)—i.e., from above—whereas the latter illustrates how the retention apparatus (208) engages with the expansion slot (204) when fastened thereto. In reference to the latter, more specifically, the retention apparatus (208) may be secured to the expansion slot (204) through the snapping of the unbowed elongated side under the row of expansion slot ridges (240) of the expansion slot (204), as well as through the force applied by the bowed side (see e.g., FIG. 2B) of the retention apparatus (208). The row of expansion slot ridges (240), on one lateral face of the expansion slot (204), may be a standard feature exhibited in most expansion slots, such as those of the PCIe type. FIG. 2D also portrays how the hockey stick latch (228) of the retention apparatus (208) may lodge right above the hockey stick feature (210) of an expansion device (not shown).

Figure 3A:
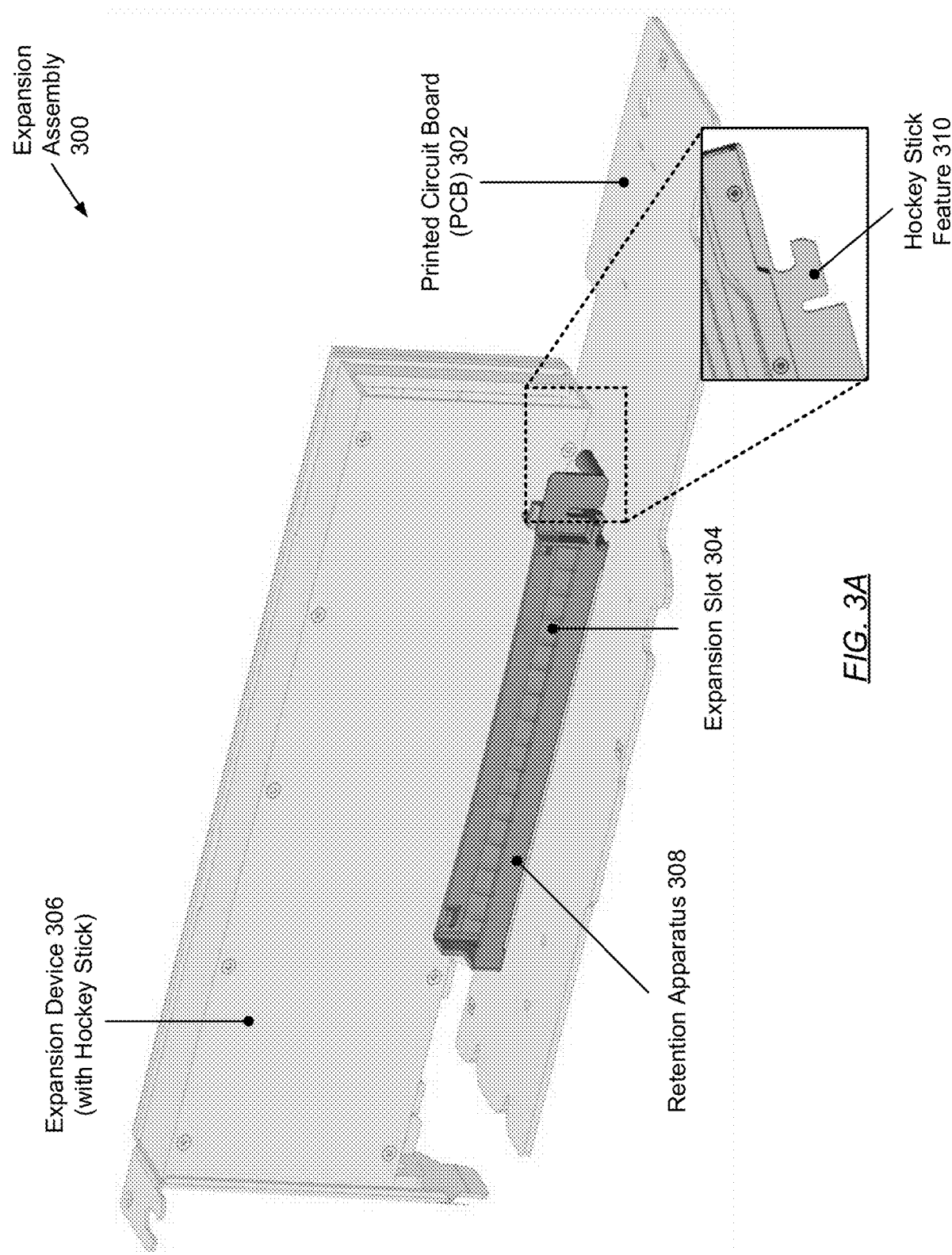
FIG. 3A shows an expansion assembly in accordance with one or more embodiments of the invention.

FIG. 3A shows an expansion assembly in accordance with one or more embodiments of the invention. An expansion assembly (300) may represent a number of components collectively integral to expansion device retention. These components may include, but are not limited to, a printed circuit board (302), an expansion slot (304), an expansion device (306), and a retention apparatus (308).

In one embodiment of the invention, the printed circuit board (302) may represent the main system board (or motherboard) of a computing system, or an interconnection board (e.g., riser card or backplane) incorporated therein (see e.g., FIGS. 1A and 1B). Amongst a bevy of electronic subcomponents interconnected through various conductive pathways and contacts, the printed circuit board (302) may include one or more expansion slots (304) mounted thereon. Each expansion slot (304) (described above) may serve as a mechanical and electrical coupler between an expansion device (306) and the printed circuit board (302). Further, the expansion device (306) may present a hockey stick shaped feature (310) on its bottom (near its edge connector), which may be designed to assist retention mechanisms either mounted directly on the printed circuit board (302) or integrated into the expansion slot (304). The retention apparatus (308) (described in further detail below (see e.g., FIG. 3B)) may subsequently fasten around the expansion slot (304) and latch onto the hockey stick shaped feature (310) of the expansion device (306) to minimize, if not eliminate, expansion device (306) movement, especially during shock events, without permanent redesign and/or modification to the printed circuit board (302).

Figure 3B:
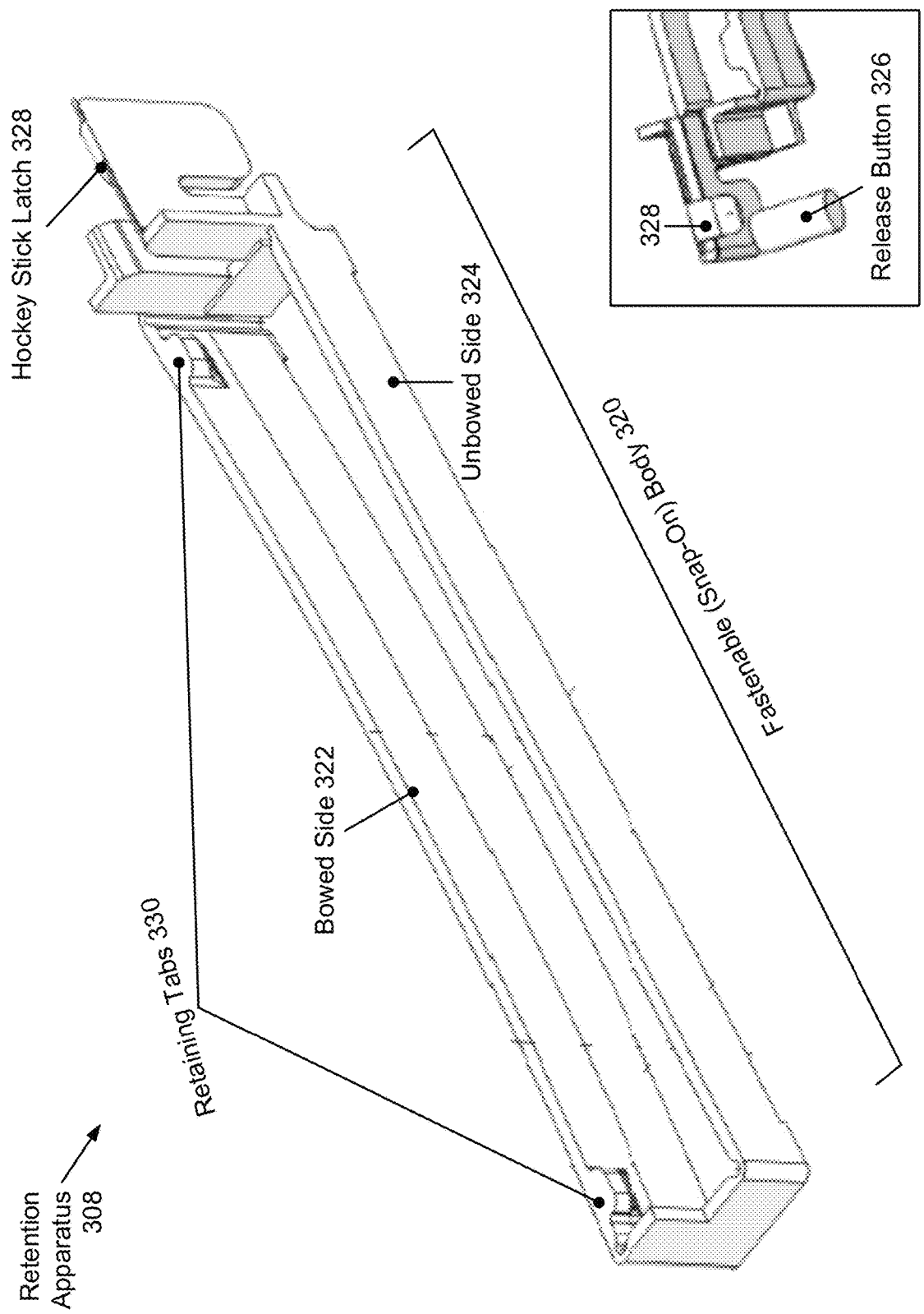
FIG. 3B shows a retention apparatus in accordance with one or more embodiments of the invention.

FIG. 3B shows a retention apparatus in accordance with one or more embodiments of the invention. The retention apparatus (308) may include a fastenable body (320) and a release mechanism in the form of a release button (326). The fastenable body (320) may form a closed hollow cuboid including four sides, which may respectively hug, when fastened (or snapped) around, the four lateral faces of an expansion slot (not shown). Of the four sides, two oppositely disposed sides may be elongated similar to the length of the expansion slot, while the remaining two oppositely disposed sides may be shortened similar to the width of the expansion slot. Further, one of the elongated sides—i.e., a bowed side (322)—may be curved, whereas the remaining three sides may be straight or unbowed—e.g., unbowed side (324). The bowed side (322) of the fastenable body (320) may serve two purposes: (a) to provide compliance for snapping onto the expansion slot; and (b) to provide force to keep the oppositely disposed elongated side under the ridges of the expansion slot (see e.g., FIG. 3C). The fastenable body (320) may also include two retaining tabs (330) each disposed at an opposing top edge of the bowed side (322). These retaining tabs (330) may function to secure the retention apparatus (308) in place when actuating the release button (326).

In turn, in one embodiment of the invention, the release button (326) may be affixed to one of the shortened sides of the fastenable body (320). The release button (326) may include a hockey stick latch (328), which may align with and lodge against the hockey stick shaped feature (see e.g., FIG. 3A) of a retained expansion device (not shown). Furthermore, the release button (326) may function to unfasten the fastenable body (320), and accordingly, the retention apparatus (308), from the expansion slot (not shown) when actuated. More specifically, when actuated, the release button (326) may dislodge the hockey stick latch (328) from the hockey stick shaped feature of the retained expansion device, as well as straighten (or unbow) the bowed side (322) of the fastenable body (320). Straightening the bowed side (322) may relieve the force applied by the bowed side (322), which had kept the oppositely disposed elongated side secured under ridges of the expansion slot. Moreover, the release button (326) may also function as a handle for handling the retention apparatus (308).

In one embodiment of the invention, the retention apparatus (308) may be manufactured through, for example, injection molding. Injection molding may refer to a manufacturing process where heated material may be injected into a mold cavity, where the heated material eventually cools and hardens to the configuration of the mold cavity. Further, the heated material may include, but is not limited to, non-conductive material, such as thermoplastics (e.g., nylon, polyethylene, and polystyrene) or thermosetting plastics (e.g., epoxy and phenolic polymers/resins).

Figure 3C:
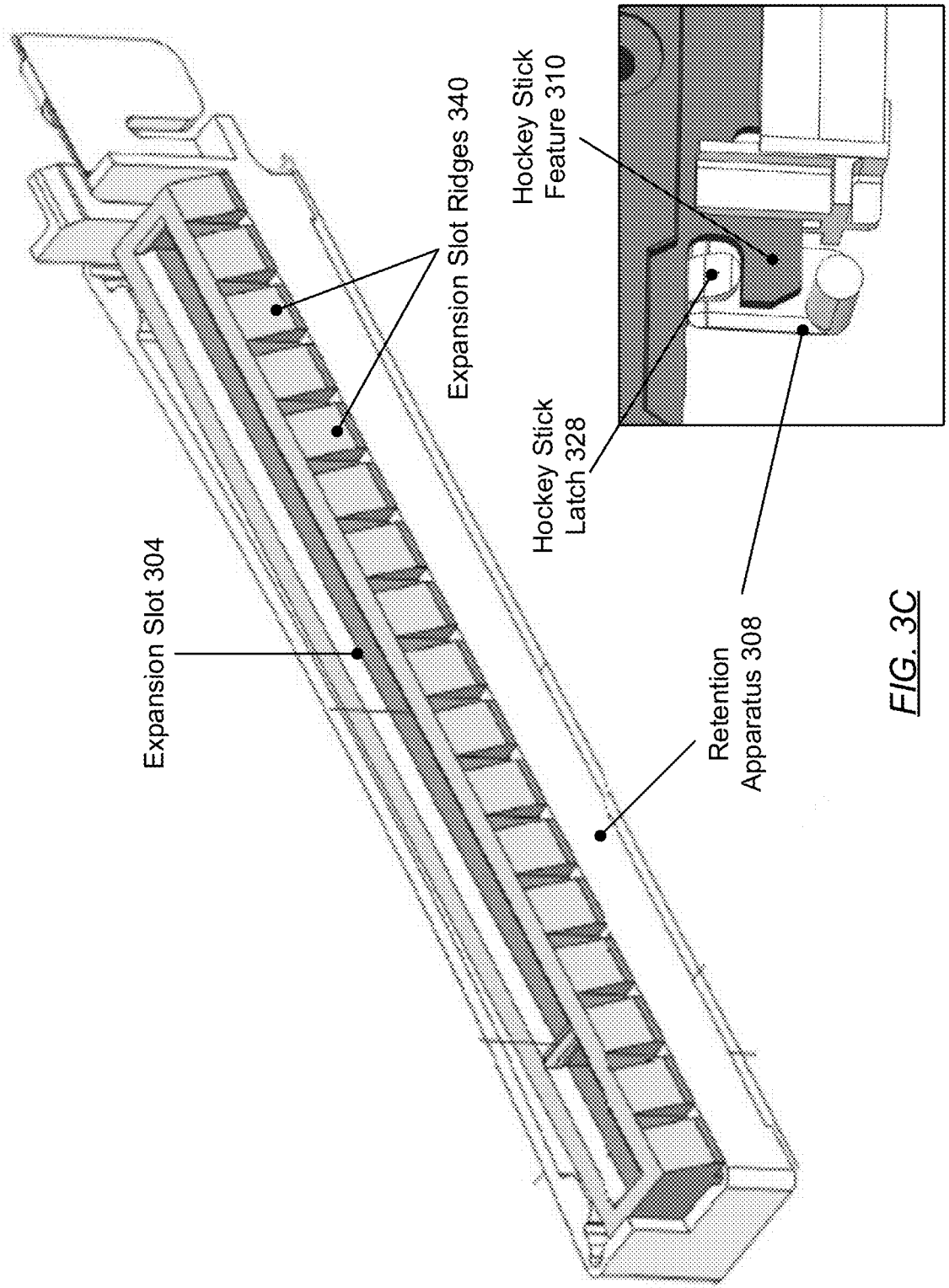
FIG. 3C shows a post-assembly of components in accordance with one or more embodiments of the invention.

FIG. 3C shows a post-assembly of components in accordance with one or more embodiments of the invention. Specifically, how the retention apparatus (308) engages with the expansion slot (304) when fastened thereto is illustrated. Similar to the retention apparatus described above in FIGS. 3A-3D, the retention apparatus (308) here may be secured to the expansion slot (304) through the snapping of the unbowed elongated side under the row of expansion slot ridges (340) of the expansion slot (304), as well as through the force applied by the bowed side (see e.g., FIG. 3B) of the retention apparatus (308). Likewise, the retention apparatus (308) herein may be fastened to an expansion slot (304) from above. FIG. 3C also portrays how the hockey stick latch (328) of the retention apparatus (308) may lodge right above the hockey stick feature (310) of an expansion device (not shown).

Figure 4A:
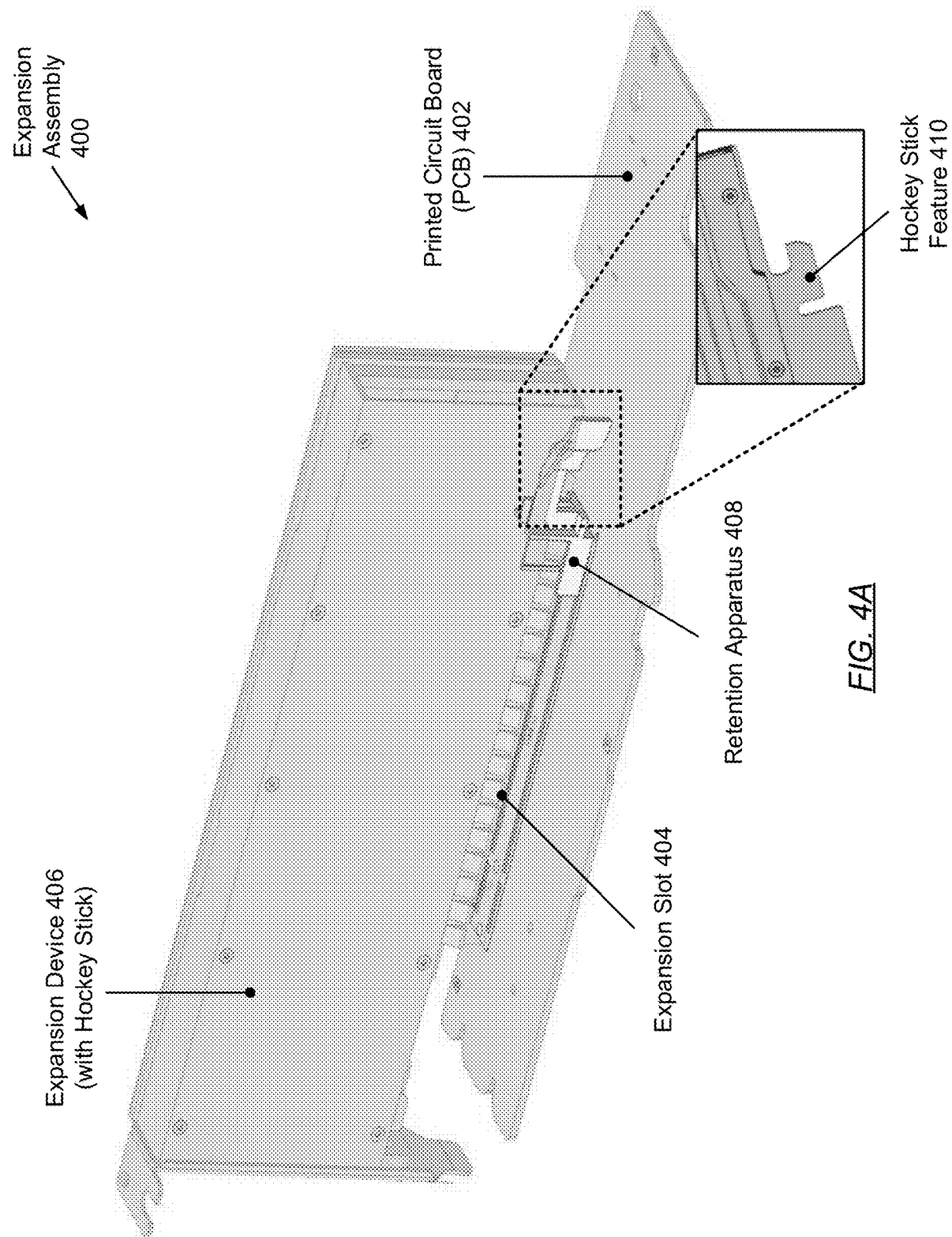
FIG. 4A shows an expansion assembly in accordance with one or more embodiments of the invention.

FIG. 4A shows an expansion assembly in accordance with one or more embodiments of the invention. An expansion assembly (400) may represent a number of components collectively integral to expansion device retention. These components may include, but are not limited to, a printed circuit board (402), an expansion slot (404), an expansion device (406), and a retention apparatus (408).

In one embodiment of the invention, the printed circuit board (402) may represent the main system board (or motherboard) of a computing system, or an interconnection board (e.g., riser card or backplane) incorporated therein (see e.g., FIGS. 1A and 1B). Amongst a bevy of electronic subcomponents interconnected through various conductive pathways and contacts, the printed circuit board (402) may include one or more expansion slots (404) mounted thereon. Each expansion slot (404) (described above) may serve as a mechanical and electrical coupler between an expansion device (406) and the printed circuit board (402). Further, the expansion device (406) may present a hockey stick shaped feature (410) on its bottom (near its edge connector), which may be designed to assist retention mechanisms either mounted directly on the printed circuit board (402) or integrated into the expansion slot (404). The retention apparatus (408) (described in further detail below (see e.g., FIG. 4B)) may subsequently fasten to the expansion slot (404) and latch onto the hockey stick shaped feature (410) of the expansion device (406) to minimize, if not eliminate, expansion device (406) movement, especially during shock events, without permanent redesign and/or modification to the printed circuit board (402).

Figure 4B:
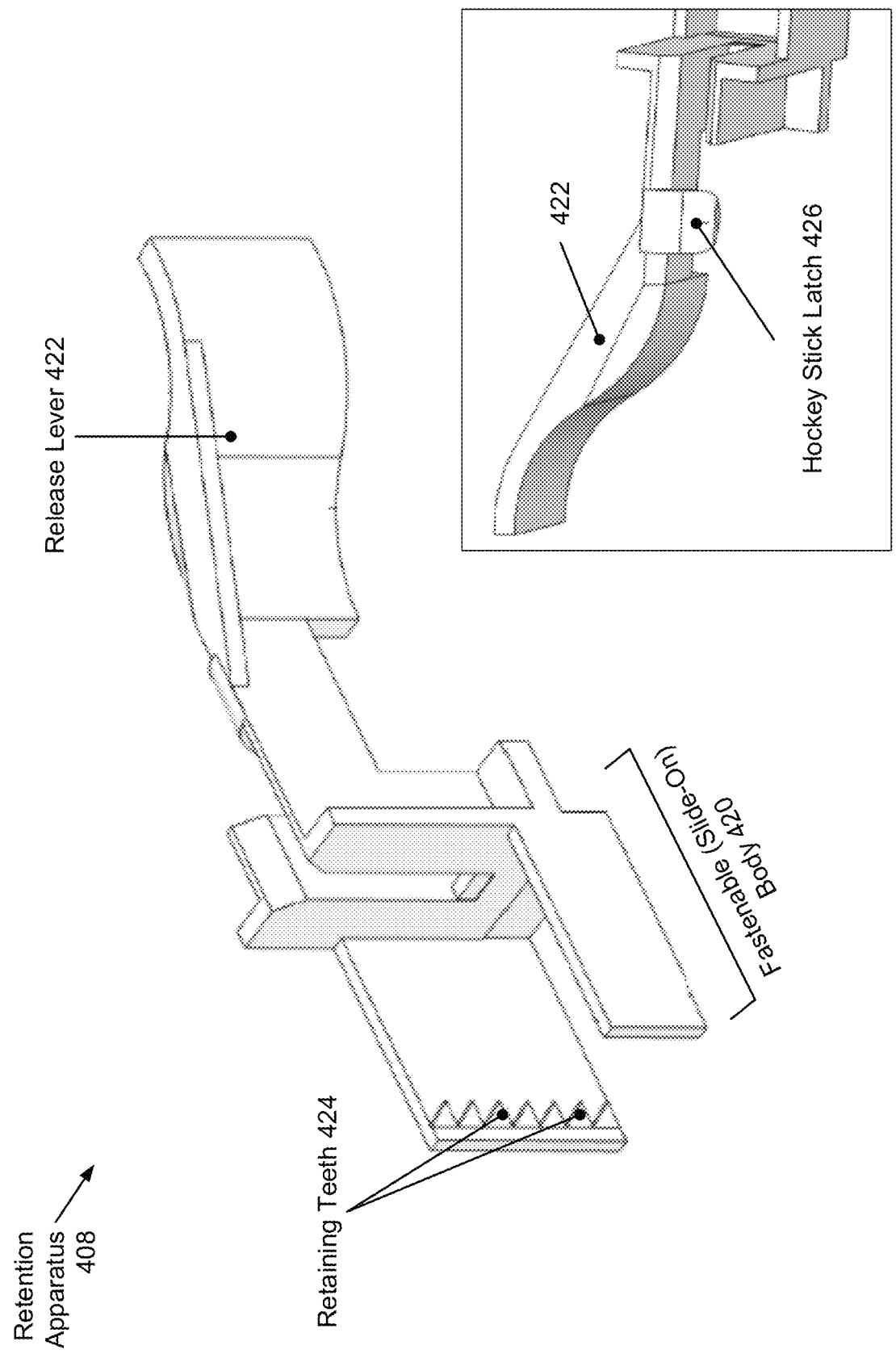
FIG. 4B shows a retention apparatus in accordance with one or more embodiments of the invention.

FIG. 4B shows a retention apparatus in accordance with one or more embodiments of the invention. The retention apparatus (408) may include a fastenable body (420) and a release mechanism in the form of a release lever (422). The fastenable body (420) may form an open hollow cuboid including three sides, which may respectfully touch, when fastened to, at least a portion of three lateral faces of an expansion slot (not shown). Of the three sides, one side may be shortened to the width of the expansion slot and may represent the side to which the release lever (422) may be affixed. The remaining two sides, adjacent to the aforementioned release lever (422) side, may each include a row of retaining teeth (424) lining the open edge of their respective inner surfaces. Each row of retaining teeth (424) may function to fasten (or secure) the retention apparatus (408) onto the length-wise lateral faces of the expansion slot.

In one embodiment of the invention, as mentioned above, the release lever (422) may be affixed to a expansion slot width shortened side of the fastenable body (420). The release lever (422) may include a hockey stick latch (426), which may align with and lodge against the hockey stick shaped feature (see e.g., FIG. 4A) of a retained expansion device (not shown). Furthermore, the release lever (422) may function to unfasten the fastenable body (420), and accordingly, the retention apparatus (408), from the expansion slot (not shown) when actuated. More specifically, when actuated, the release lever (422) may dislodge the hockey stick latch (426) from the hockey stick shaped feature of the retained expansion device. Moreover, the release lever (426) may also function as a handle for handling the retention apparatus (408).

In one embodiment of the invention, the retention apparatus (408) may be manufactured through, for example, injection molding. Injection molding may refer to a manufacturing process where heated material may be injected into a mold cavity, where the heated material eventually cools and hardens to the configuration of the mold cavity. Further, the heated material may include, but is not limited to, non-conductive material, such as thermoplastics (e.g., nylon, polyethylene, and polystyrene) or thermosetting plastics (e.g., epoxy and phenolic polymers/resins).

Figure 4C:
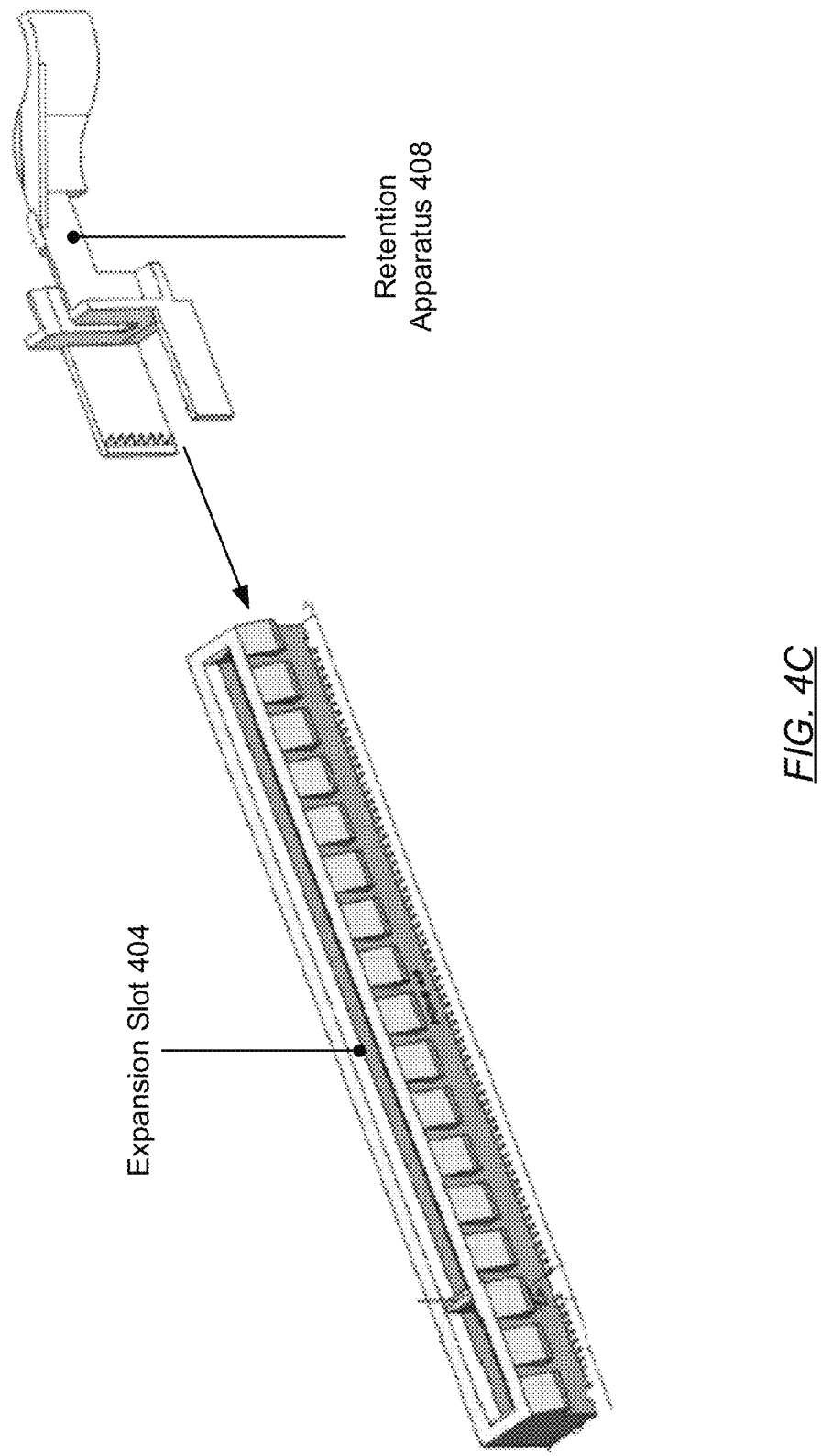
FIG. 4C shows a pre-assembly of components in accordance with one or more embodiments of the invention.
Figure 4D:
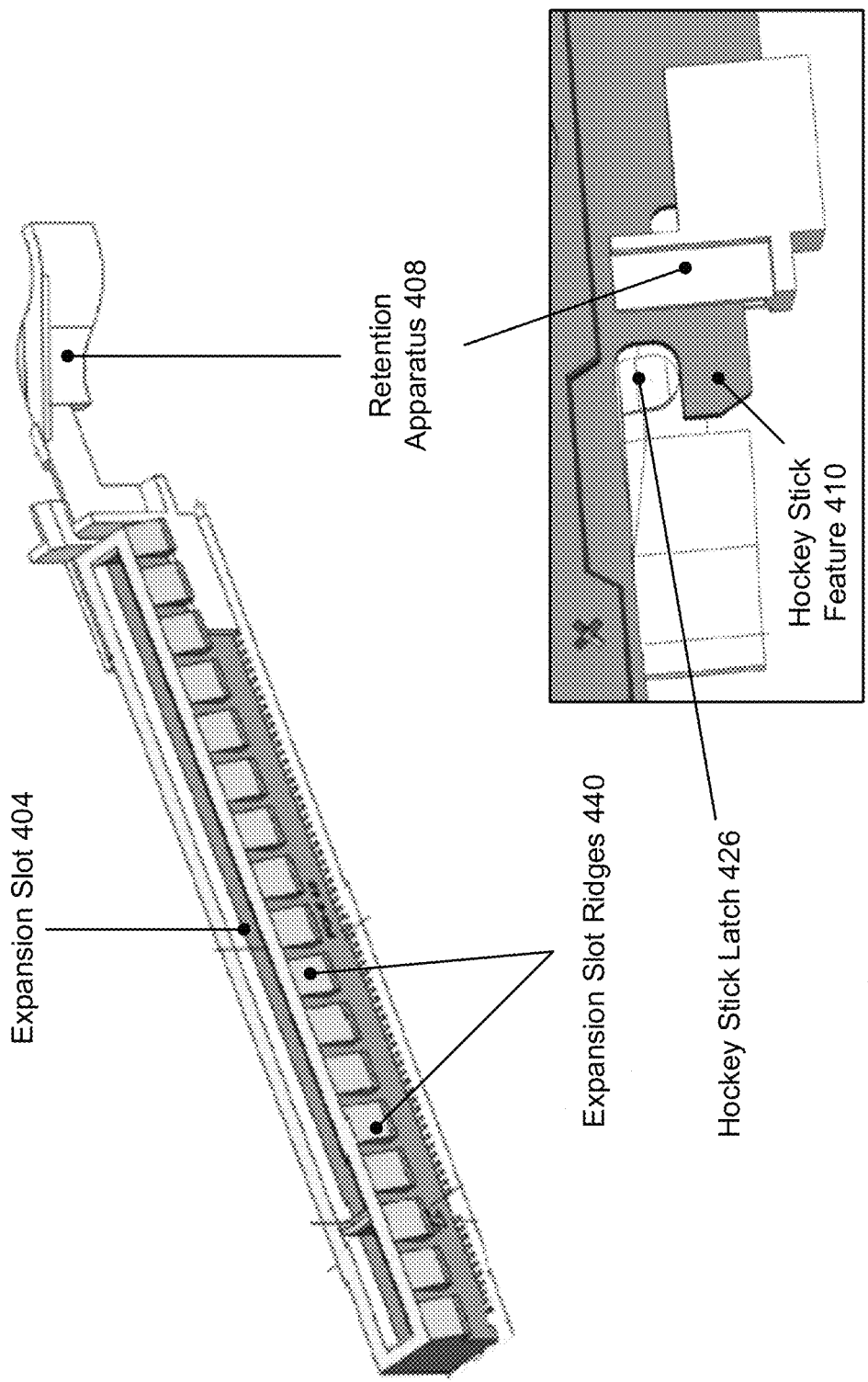
FIG. 4D shows a post-assembly of components in accordance with one or more embodiments of the invention.

FIGS. 4C and 4D show a pre-assembly and post-assembly, respectively, of components in accordance with one or more embodiments of the invention. Specifically, the former illustrates how a retention apparatus (408) may be fastened (by way of a sliding mechanism) to an expansion slot (404)—i.e., normal to the width-wise lateral face of the expansion slot (404) closest to the position of the hockey stick shaped feature of an expansion device (not shown)—whereas the latter illustrates how the retention apparatus (408) engages with the expansion slot (404) when fastened thereto. In reference to the latter, more specifically, the retention apparatus (408) may be secured to the expansion slot (404) through the gripping of a row of retaining teeth (see e.g., FIG. 4B) on both length-wise lateral faces of the expansion slot (404). One of the sides of the retention apparatus (408), adjacent to the release lever side, may be secured under the row of expansion slot ridges (440) of the expansion slot (404). The row of expansion slot ridges (440), on one lateral face of the expansion slot (404), may be a standard feature exhibited in most expansion slots, such as those of the PCIe type. FIG. 4D also portrays how the hockey stick latch (426) of the retention apparatus (408) may lodge right above the hockey stick feature (410) of an expansion device (not shown).

Figure 5A:
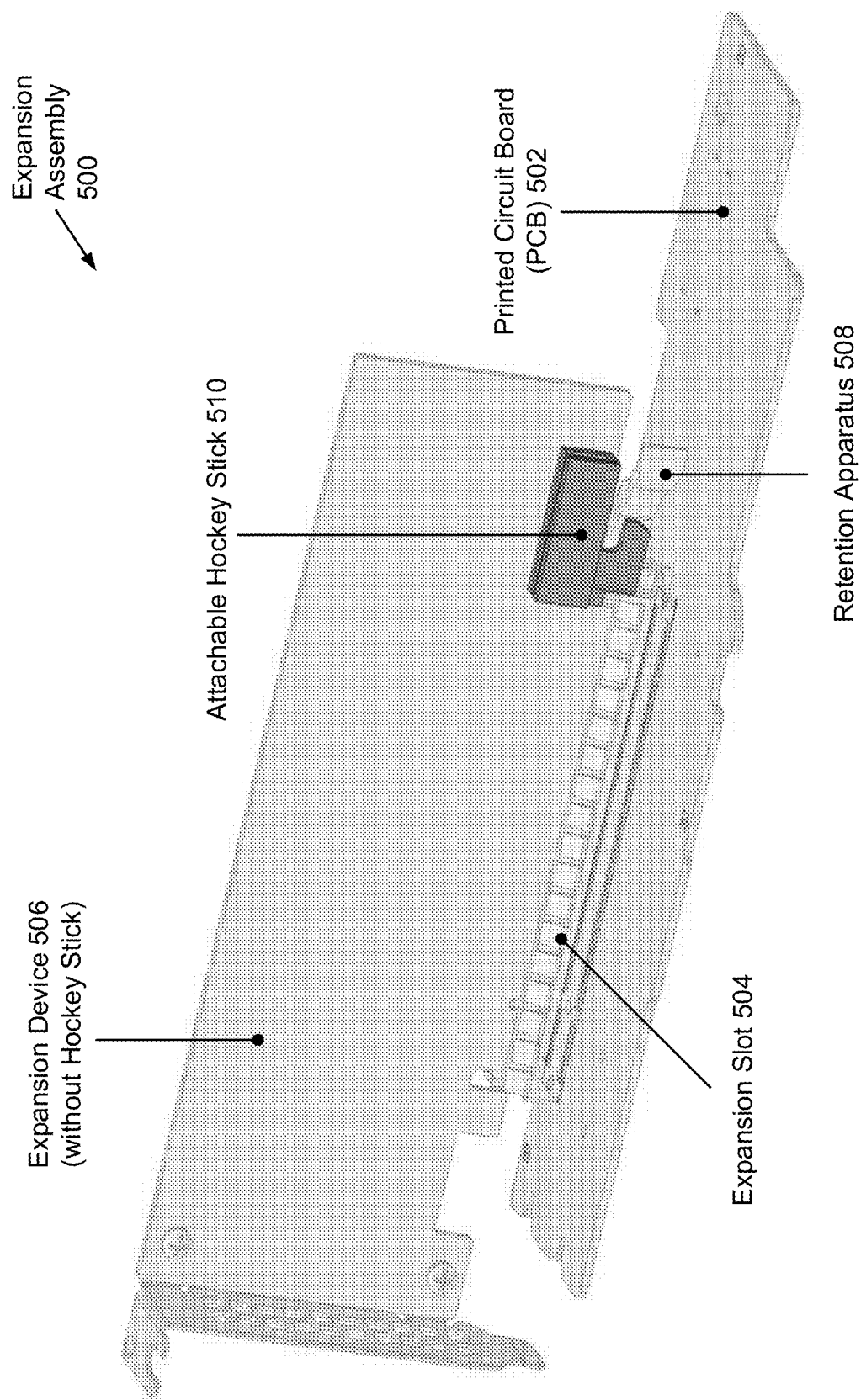
FIG. 5A shows an expansion assembly in accordance with one or more embodiments of the invention.

FIG. 5A shows an expansion assembly in accordance with one or more embodiments of the invention. An expansion assembly (500) may represent a number of components collectively integral to expansion device retention. These components may include, but are not limited to, a printed circuit board (502), an expansion slot (504), an expansion device (506), a retention apparatus (508), and an attachable hockey stick (510).

In one embodiment of the invention, the printed circuit board (502) may represent the main system board (or motherboard) of a computing system, or an interconnection board (e.g., riser card or backplane) incorporated therein (see e.g., FIGS. 1A and 1B). Amongst a bevy of electronic subcomponents interconnected through various conductive pathways and contacts, the printed circuit board (502) may include one or more expansion slots (504) mounted thereon.

Each expansion slot (504) (described above) may serve as a mechanical and electrical coupler between an expansion device (506) and the printed circuit board (502). Further, the expansion device (506) may not present a hockey stick shaped feature (see e.g., FIGS. 2A, 3A, and/or 4A) on its bottom (near its edge connector), which may be designed to assist retention mechanisms either mounted directly on the printed circuit board (502) or integrated into the expansion slot (504). The attachable hockey stick (510), accordingly, may be fastened to the expansion device (506) whereat a hockey stick feature ought to be and to mitigate the lack thereof on the expansion device (506). The retention apparatus (508) (described in further detail above (see e.g., FIGS. 2B, 3B, and/or 4B)) may subsequently fasten to the expansion slot (504) and latch onto attachable hockey stick (510) fastened to the expansion device (506) to minimize, if not eliminate, expansion device (506) movement, especially during shock events, without permanent redesign and/or modification to the printed circuit board (502).

Figure 5B:
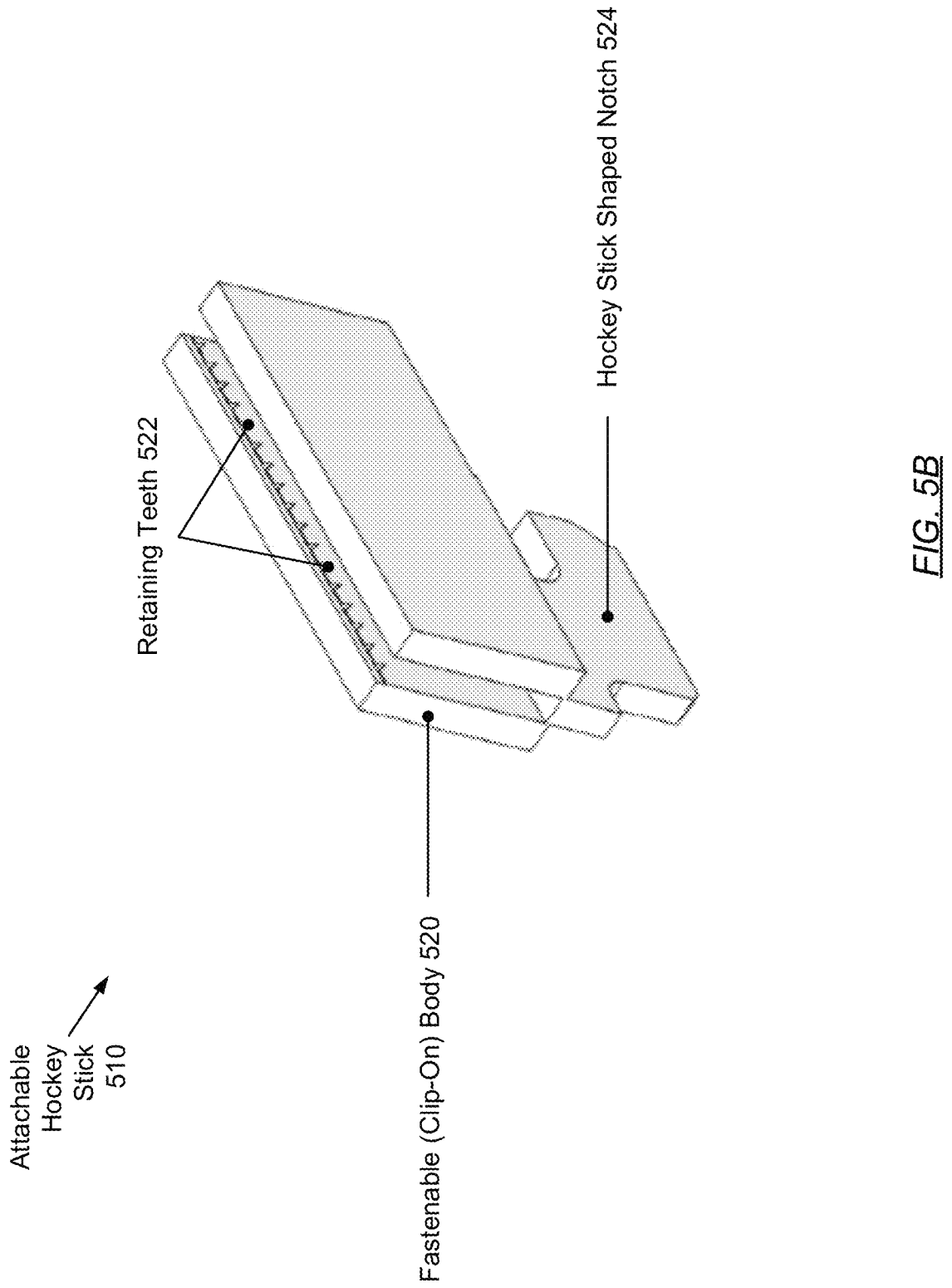
FIG. 5B shows an attachable hockey stick in accordance with one or more embodiments of the invention.

FIG. 5B shows an attachable hockey stick in accordance with one or more embodiments of the invention. The attachable hockey stick (510) may include a fastenable (clip-on) body (520) and a hockey stick shaped notch (524). The fastenable body (520) may be implemented as two plates oppositely disposed to one another and separated by a gap equivalent to the width of an expansion device (not shown) or the edge connector thereof. Each plate may include a row of retaining teeth (522) that line the topmost edge of their respective inner surfaces. Further, each row of retaining teeth (522) may function to fasten (or secure) the attachable hockey stick (510) onto a surface of the expansion device. The hockey stick shaped notch (524), moreover, may be affixed beneath the fastenable body (520), positioned directly below the above-mentioned gap between the two plates thereof.

In one embodiment of the invention, the attachable hockey stick (510) may be manufactured through, for example, injection molding. Injection molding may refer to a manufacturing process where heated material may be injected into a mold cavity, where the heated material eventually cools and hardens to the configuration of the mold cavity. Further, the heated material may include, but is not limited to, non-conductive material, such as thermoplastics (e.g., nylon, polyethylene, and polystyrene) or thermosetting plastics (e.g., epoxy and phenolic polymers/resins).

Figure 5C:
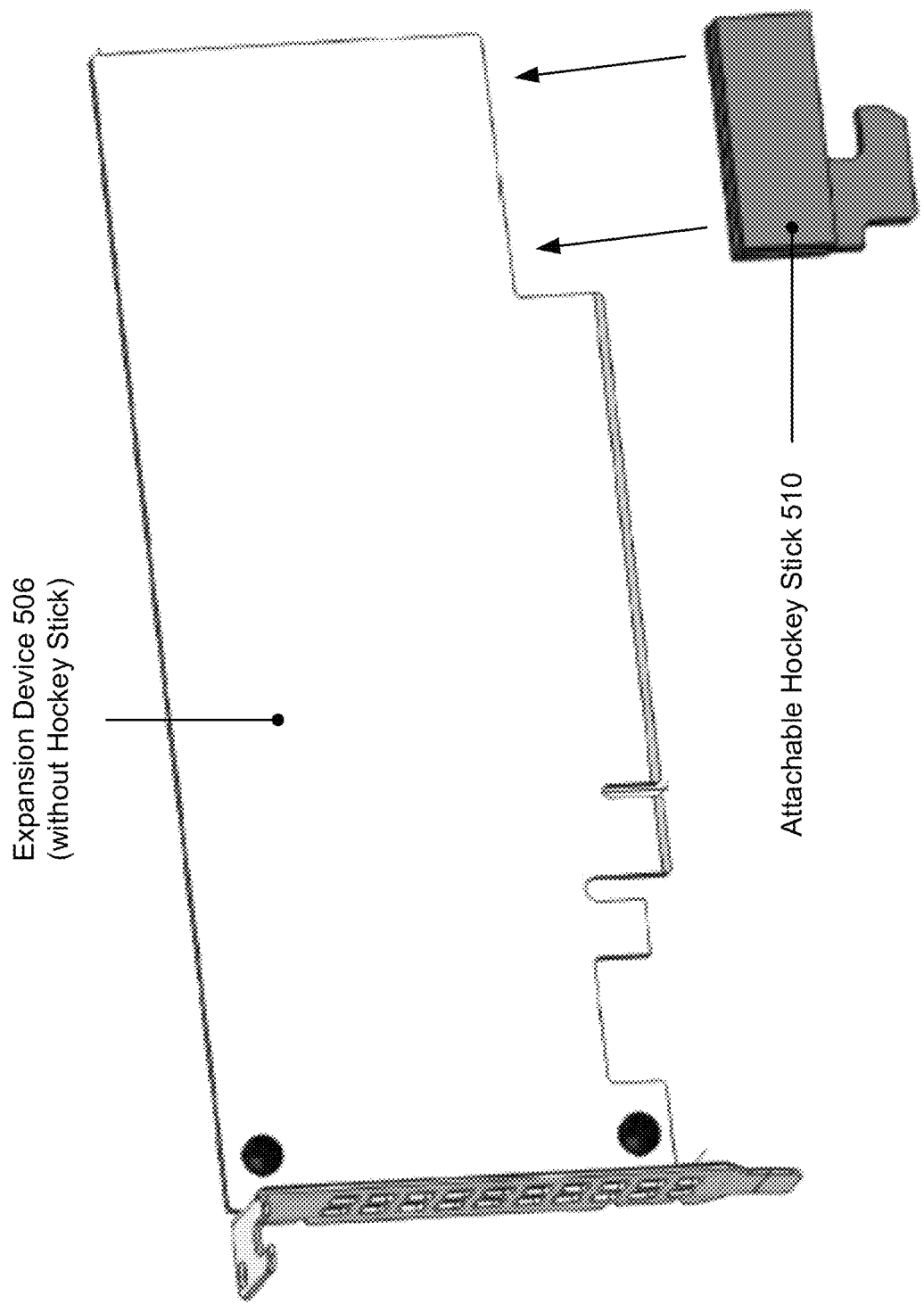
FIG. 5C shows a pre-assembly of components in accordance with one or more embodiments of the invention.
Figure 5D:
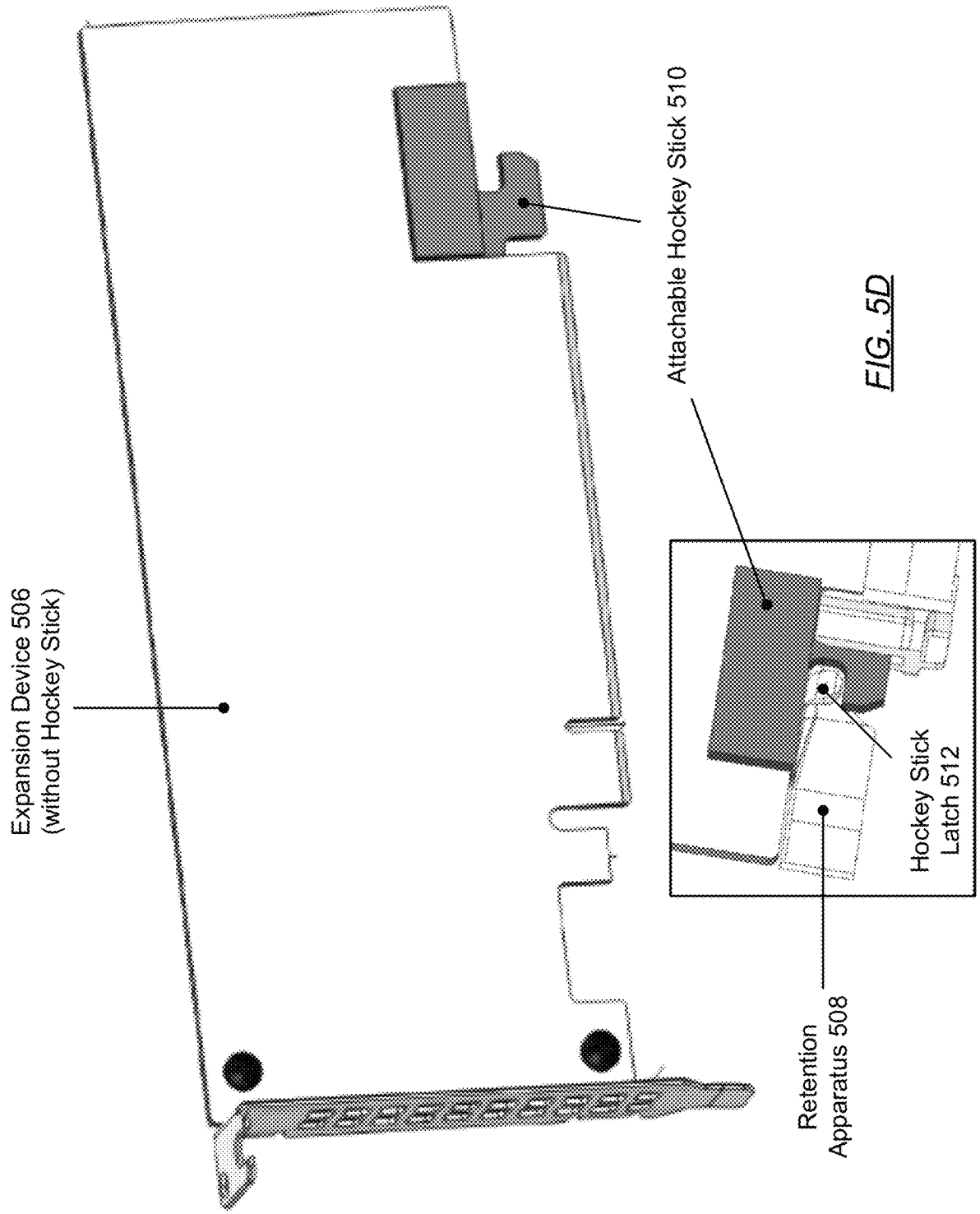
FIG. 5D shows a post-assembly of components in accordance with one or more embodiments of the invention.

FIGS. 5C and 5D show a pre-assembly and post-assembly, respectively, of components in accordance with one or more embodiments of the invention. Specifically, the former illustrates how an attachable hockey stick (510) may be fastened (by way of a clipping mechanism) to an expansion device (506)—i.e., onto an edge of the expansion device (506) where a hockey stick shaped feature ought to be—whereas the latter illustrates how the attachable hockey stick (510) engages with the expansion device (506) when fastened thereto. In reference to the latter, more specifically, the attachable hockey stick (510) may be secured to the expansion device (506) through the gripping of rows of retaining teeth (see e.g., FIG. 5B) on both surfaces of the expansion device (506). FIG. 5D also portrays how a hockey stick latch (512) of a retention apparatus (508) may lodge right above the hockey stick shaped notch of the attachable hockey stick (510).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for expansion device retention, comprising:
 a fastenable body capable of fastening to an expansion slot for an expansion device; and
 a release mechanism affixed to the fastenable body, which when actuated, unfastens the fastenable body from the expansion slot,
 wherein the release mechanism comprises a hockey stick latch configured to lodge against one selected from a first group consisting of a hockey stick feature of the expansion device and an attachable hockey stick fastened to the expansion device lacking the hockey stick feature, when the expansion device is installed at the expansion slot,
 wherein the release mechanism further comprises one selected from a second group consisting of a release lever and a release button, which when actuated, dislodges the hockey stick latch from the one selected from the first group,
 wherein the fastenable body comprises a bowed side and an unbowed side oppositely disposed to the bowed side,
 wherein the bowed side applies a force keeping the unbowed side fastened to the expansion slot,
 wherein the one selected from the second group, when actuated, relieves the force keeping the unbowed side fastened, and
 wherein the unbowed side is kept fastened under a row of expansion slot ridges of the expansion slot.

2. The apparatus of claim 1, wherein the fastenable body comprises retaining teeth facilitating a fastening of the fastenable body to the expansion slot.

3. A computing system, comprising:
 a printed circuit board;
 an expansion slot mounted on the printed circuit board;
 an expansion device installed at the expansion slot and comprising a hockey stick feature; and
 an apparatus for expansion device retention, comprising:
  a fastenable body capable of fastening to the expansion slot; and
  a release mechanism affixed to the fastenable body, which when actuated, unfastens the fastenable body from the expansion slot,
 wherein the release mechanism comprises a hockey stick latch configured to lodge against the hockey stick feature of the expansion device when the expansion device is installed at the expansion slot,
 wherein the release mechanism further comprises one selected from a group consisting of a release lever and a release button, which when actuated, dislodges the hockey stick latch from the hockey stick feature of the expansion device,
 wherein the fastenable body comprises a bowed side and an unbowed side oppositely disposed to the bowed side,
 wherein the bowed side applies a force keeping the unbowed side fastened to the expansion slot,
 wherein the one selected from the group, when actuated, relieves the force keeping the unbowed side fastened, and
 wherein the unbowed side is kept fastened under a row of expansion slot ridges of the expansion slot.

4. The computing system of claim 3, wherein the printed circuit board is one selected from a second group consisting of a main system board and an interconnection board.

5. The computing system of claim 3, wherein the expansion slot mechanically and electrically couples the expansion device and the printed circuit board.

6. The computing system of claim 3, wherein the expansion slot is of a peripheral component interconnect express (PCIe) type, wherein the expansion device further comprises an edge connector of the PCIe type, wherein the edge connector mates with the expansion slot.

7. The computing system of claim 3, wherein the computing system is one selected from a second group consisting of a desktop computer and a server.

8. A computing system, comprising:
 a printed circuit board;
 an expansion slot mounted on the printed circuit board;
 an expansion device installed at the expansion slot and lacking a hockey stick feature;
 an attachable hockey stick fastened to the expansion device; and
 an apparatus for expansion device retention, comprising:
  a fastenable body capable of fastening to the expansion slot; and
  a release mechanism affixed to the fastenable body, which when actuated, unfastens the fastenable body from the expansion slot,
 wherein the release mechanism comprises a hockey stick latch configured to lodge against a hockey stick shaped notch of the attachable hockey stick fastened to the expansion device,
 wherein the release mechanism further comprises one selected from a group consisting of a release lever and a release button, which when actuated, dislodges the hockey stick latch from the hockey stick shaped notch of the attachable hockey stick fastened to the expansion device,
 wherein the fastenable body comprises a bowed side and an unbowed side oppositely disposed to the bowed side,
 wherein the bowed side applies a force keeping the unbowed side fastened to the expansion slot,
 wherein the one selected from the group, when actuated, relieves the force keeping the unbowed side fastened, and
 wherein the unbowed side is kept fastened under a row of expansion slot ridges of the expansion slot.

9. The computing system of claim 8, wherein the attachable hockey stick comprises retaining teeth facilitating a fastening of the attachable hockey stick to the expansion device.

10. The computing system of claim 8, wherein the printed circuit board is one selected from a second group consisting of a main system board and an interconnection board.

11. The computing system of claim 8, wherein the expansion slot mechanically and electrically couples the expansion device and the printed circuit board.

12. The computing system of claim 8, wherein the expansion slot is of a peripheral component interconnect express (PCIe) type, wherein the expansion device further comprises an edge connector of the PCIe type, wherein the edge connector mates with the expansion slot.

13. The computing system of claim 8, wherein the computing system is one selected from a second group consisting of a desktop computer and a server.

* * * * *